United States Patent
Hiyama et al.

(10) Patent No.: US 7,737,466 B1
(45) Date of Patent: Jun. 15, 2010

(54) SEMICONDUCTOR DEVICE AND MANUFACTURING METHOD THEREOF

(75) Inventors: Kaoru Hiyama, Yokohama (JP); Tomoya Sanuki, Yokohama (JP); Osamu Fujii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 11/889,420

(22) Filed: Aug. 13, 2007

Related U.S. Application Data

(62) Division of application No. 11/026,542, filed on Jan. 3, 2005, now abandoned.

(30) Foreign Application Priority Data

Jan. 6, 2004 (JP) ............... 2004-001075

(51) Int. Cl.
*H01L 29/06* (2006.01)
*H01L 35/26* (2006.01)

(52) U.S. Cl. ............... 257/190; 257/191; 257/192; 257/194; 257/18; 257/19; 257/616; 257/E29.246

(58) Field of Classification Search ............... 257/190, 257/191, 194, 18, 19, 616, E29.246
See application file for complete search history.

(56) References Cited

U.S. PATENT DOCUMENTS

| | | | |
|---|---|---|---|
| 5,998,807 | A | 12/1999 | Lustig et al. |
| 6,509,587 | B2 | 1/2003 | Sugiyama et al. |
| 6,593,641 | B1 | 7/2003 | Fitzergald |
| 6,750,486 | B2 | 6/2004 | Sugawara et al. |
| 6,835,981 | B2 | 12/2004 | Yamada et al. |
| 6,982,229 | B2 | 1/2006 | Suvkhanov et al. |
| 2001/0003364 | A1 | 6/2001 | Sugawara et al. |
| 2002/0168802 | A1 | 11/2002 | Hsu et al. |
| 2003/0030091 | A1 | 2/2003 | Bulsara et al. |
| 2004/0009636 | A1 | 1/2004 | Ichinose et al. |
| 2004/0206950 | A1* | 10/2004 | Suvkhanov et al. ........... 257/19 |
| 2004/0217391 | A1 | 11/2004 | Forbes |
| 2005/0104131 | A1 | 5/2005 | Chidambarrao et al. |
| 2005/0139921 | A1 | 6/2005 | Kang et al. |

(Continued)

FOREIGN PATENT DOCUMENTS

JP          10-107294 A          4/1998

(Continued)

OTHER PUBLICATIONS

K. Hiyama et al., U.S. PTO Office Action, U.S. Appl. No. 11/026,542, Sep. 7, 2007, 8 pages.

(Continued)

*Primary Examiner*—Kenneth A Parker
*Assistant Examiner*—Joseph Nguyen
(74) *Attorney, Agent, or Firm*—Foley & Lardner LLP

(57) ABSTRACT

A semiconductor device includes a substrate having a first area and a second area adjacent to the first area, a first silicon layer provided on the substrate in the first area, a relaxed layer which is provided on the substrate in the second area and which has a lattice constant greater than a lattice constant of the first silicon layer, and a strained-Si layer which is provided on the relaxed layer and which has a lattice constant substantially equivalent to the lattice constant of the relaxed layer.

20 Claims, 10 Drawing Sheets

U.S. PATENT DOCUMENTS

2006/0237747 A1    10/2006    Suzuki et al.

FOREIGN PATENT DOCUMENTS

| JP | 11-340337 A | 12/1999 |
| JP | 2002-076347 A | 3/2002 |
| JP | 2003-100900 A | 4/2003 |
| JP | 2003-158250 A | 5/2003 |
| JP | 2004-165197 A | 6/2004 |

OTHER PUBLICATIONS

U.S. Appl. No. 11/889,451, filed Aug. 13, 2007, Hiyama et al.

K. Hiyama, U.S. PTO Office Action, U.S. Appl. No. 11/026,542, Feb. 26, 2008, 10 pages.

Shin-Ichi Takagi et al., "Device Structure and Electrical Characteristics of Strained-Si-on-Insulator (Strained-SOI) MOSFETs", Toshiba Corporation—Technical Report of The Institute of Electronics, Information and Communications Engineers (IEICE), Mar. 2001, pp. 31-38.

Kaoru Hiyama, U.S. PTO Office Action, U.S. Appl. No. 11/889,451, dated Sep. 4, 2009, 14 pages.

* cited by examiner

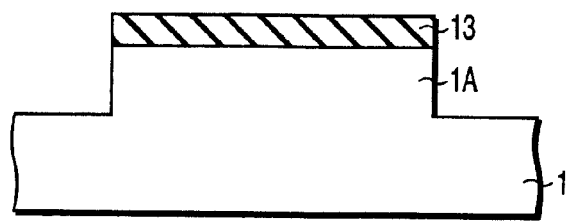
F I G. 12
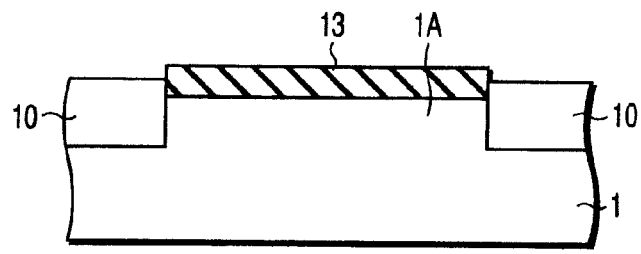
F I G. 13
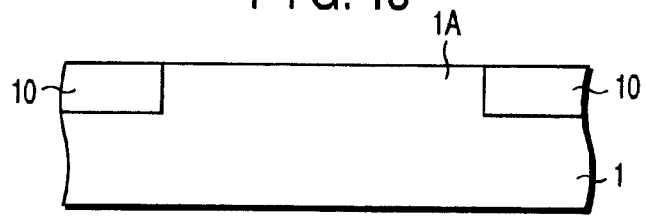
F I G. 14
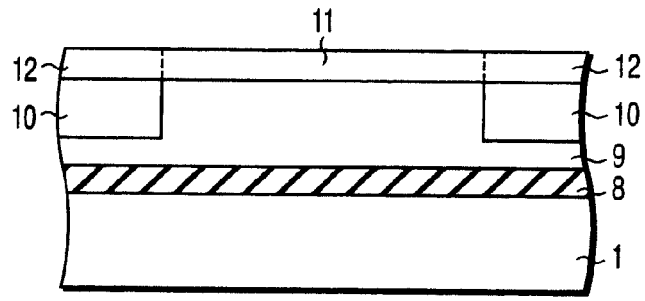
F I G. 15
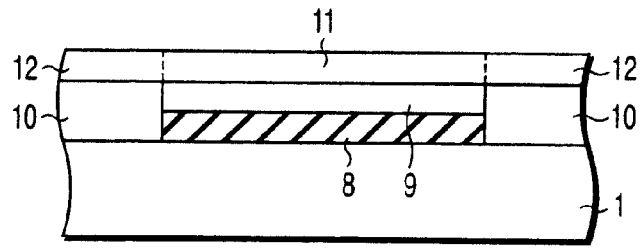
F I G. 16

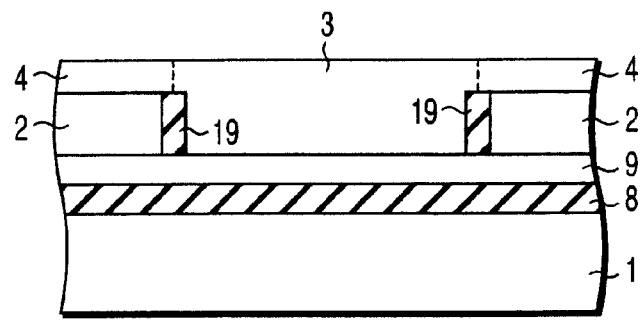
F I G. 30
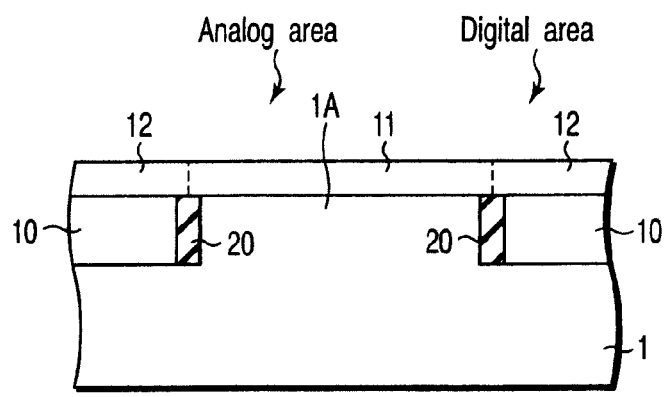
F I G. 31
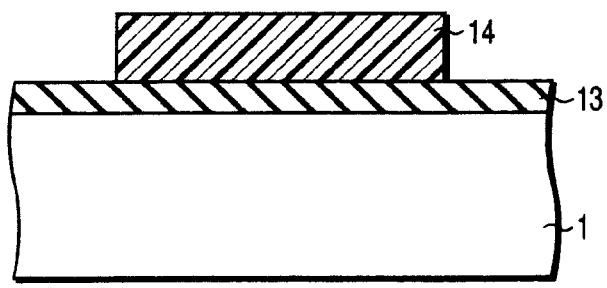
F I G. 32
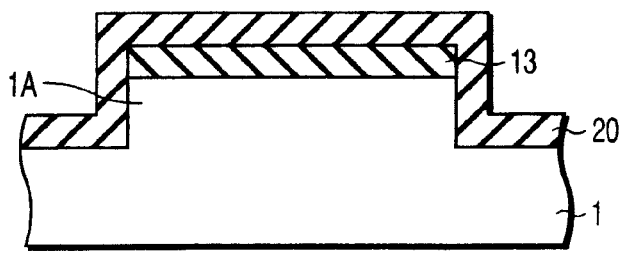
F I G. 33

SEMICONDUCTOR DEVICE AND MANUFACTURING METHOD THEREOF

CROSS-REFERENCE TO RELATED APPLICATIONS

This application is a divisional of U.S. patent application Ser. No. 11/026,542, filed Jan. 3, 2005, based upon and claims the benefit of priority from prior Japanese Patent Application No. 2004-001075, filed Jan. 6, 2004, the entire contents of which are incorporated herein by reference.

BACKGROUND OF THE INVENTION

1. Field of the Invention

This invention relates to a semiconductor device and a manufacturing method thereof and, more particularly, to a semiconductor device comprising a CMOS (Complementary Metal Oxide Semiconductor) device, a memory device and the like on the same substrate and a manufacturing method thereof.

2. Description of the Related Art

Recently, a faster semiconductor device and a lower power consumption thereof have been increasingly required. For example, faster operations of a CMOS device provided in a semiconductor device and lower power consumption thereof have been achieved by a finer device structure.

However, as the device structure becomes finer, a pattern smaller than an exposure wavelength needs to be formed by lithography. For this reason, an adequate margin of process can hardly be maintained in the lithographic step. Thus, there is a limit to satisfying the requirement of faster semiconductor device and a lower power consumption thereof by the finer device structure.

To improve a current driving power of the MOS transistor, development of providing a strained-Si layer on a semiconductor substrate and forming a MOS transistor on the strained-Si layer has been carried out. In the strained-Si layer, a banded structure of Si is varied by applying a tensile strain to Si.

The strained-Si layer is formed by forming, for example, a $Si_{1-x}Ge_x$ layer (hereinafter called a SiGe layer) having a greater lattice constant than Si on a semiconductor substrate and forming a Si layer thereon by epitaxial growth, to apply a sufficiently great tensile strain to Si. If a MOS transistor is formed on the strained-Si layer thus formed, carrier mobility is improved.

In accordance with high integration of a semiconductor device, a semiconductor device having a CMOS device with a memory device or an analog device on the same substrate is manufactured. If a semiconductor substrate having a strained-Si layer is used in such a semiconductor device, the carrier mobility of the CMOS device can be improved as explained above.

In the memory device or analog device, however, current leak or noise occurs due to influences of the strained-Si layer whose lattice constant is made greater than that of Si and the SiGe layer whose lattice constant is greater than that of Si. The characteristics of the memory device or the analog device are thereby deteriorated.

Moreover, if a small-leak type transistor or capacitor in which the current leak from a capacitor dielectric film or junction leak causes problems is formed on a strained-Si layer, the device characteristics are deteriorated. This is serious for the analog device or DRAM (Dynamic Random Access Memory) including such a device.

As for a related technique of this kind, a CMOS device capable of compensating for high charge carrier mobility by using strained silicon is disclosed (see Jpn. Pat. Appln. KOKAI Publication No. 10-107294).

BRIEF SUMMARY OF THE INVENTION

According to an aspect of the present invention, there is provided a semiconductor device comprising a substrate having a first area and a second area adjacent to the first area, a first silicon layer provided on the substrate in the first area, a relaxed layer which is provided on the substrate in the second area and which has a lattice constant greater than a lattice constant of the first silicon layer, and a strained-Si layer which is provided on the relaxed layer and which has a lattice constant substantially equivalent to the lattice constant of the relaxed layer.

According to another aspect of the present invention, there is provided a semiconductor device comprising a silicon substrate having a first area, a second area adjacent to the first area, and a protrusion arranged in the first area, a relaxed layer which is provided on the silicon substrate in the second area and which has a lattice constant greater than a lattice constant of the silicon substrate, and a strained-Si layer which is provided on the relaxed layer and which has a lattice constant substantially equivalent to the lattice constant of the relaxed layer.

According to still another aspect of the present invention, there is provided a method of manufacturing a semiconductor device, comprising preparing a substrate having a first area and a second area adjacent to the first area, forming on the substrate a relaxed layer which has a lattice constant greater than a lattice constant of silicon, coating the relaxed layer of the second area with a resist film, etching the relaxed layer by using the resist film as a mask, removing the resist film, forming a first silicon layer on the substrate in the first area, and forming a strained-Si layer on the relaxed layer by epitaxial growth.

According to further another aspect of the present invention, there is provided a method of manufacturing a semiconductor device, comprising preparing a silicon substrate having a first area and a second area adjacent to the first area, coating the silicon substrate in the first area with a resist film, etching the silicon substrate by using the resist film as a mask to form a protrusion on the silicon substrate, removing the resist film, forming a relaxed layer which has a lattice constant greater than a lattice constant of the silicon substrate, on the silicon substrate in the second area, and forming a strained-Si layer on the relaxed layer by epitaxial growth.

BRIEF DESCRIPTION OF THE SEVERAL VIEWS OF THE DRAWING

FIG. 12 is a cross-sectional view showing the manufacturing method subsequently to FIG. 11;

FIG. 13 is a cross-sectional view showing the manufacturing method subsequently to FIG. 12;

FIG. 14 is a cross-sectional view showing the manufacturing method subsequently to FIG. 13;

FIG. 15 is a cross-sectional view showing the semiconductor device of FIG. 10 having a SOI structure;

FIG. 16 is a cross-sectional view showing the semiconductor device of FIG. 15 in which SiGe layer 10 reaches a Si substrate 1;

FIG. 30 is a cross-sectional view showing the semiconductor device of FIG. 24 having a SOI structure;

FIG. 31 is a cross-sectional view showing main portions of a semiconductor device according to a fifth embodiment of the present invention;

FIG. 32 is a cross-sectional view showing a method of manufacturing the semiconductor device shown in FIG. 31;

FIG. 33 is a cross-sectional view showing the manufacturing method subsequently to FIG. 32;

DETAILED DESCRIPTION OF THE INVENTION

Embodiments of the present invention will be explained below with reference to the accompanying drawings. Elements having like or similar functions and structures are denoted by similar reference numbers. Repeated explanations are made if necessary.

First Embodiment

Figure 1:
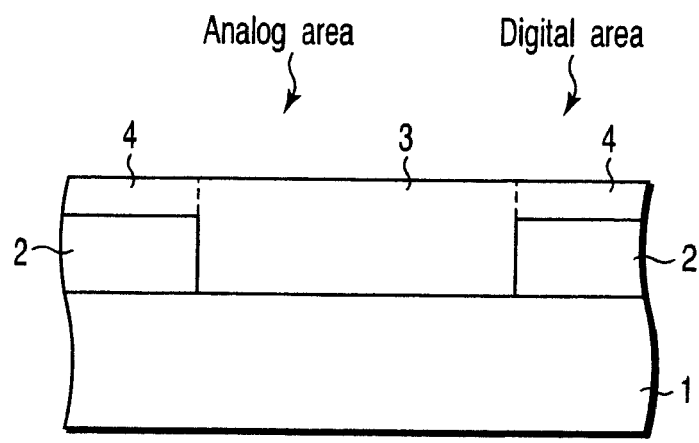
FIG. 1 is a cross-sectional view showing main portions of a semiconductor device according to a first embodiment of the present invention.

FIG. 1 is a cross-sectional view showing main portions of a semiconductor device according to a first embodiment of the present invention.

A memory device and/or an analog device, and a digital device are mounted together on the semiconductor device. The analog device implies a device which gives a great influence to the characteristics and reliability of the semiconductor device when the current leak or noise occurs. The digital device implies a device which gives a small influence to the characteristics and reliability of the semiconductor device when the current leak or noise occurs.

Specifically, the memory device includes a DRAM, an SRAM (Static Random Access Memory), a flash memory and the like. The analog device includes a capacitor, a small-leak type transistor or amplifying element processing a greatly noise-influenced high-frequency signal, and the like. The digital device includes a CMOS device, a logic circuit and the like. In the present embodiment, an area where the memory device and/or the analog device (hereinafter referred to as "analog device and the like") is formed is called an analog area, and an area where the digital device is formed is called a digital area.

A Si layer 3 is formed on the analog area of a Si substrate 1 which is formed of, for example, silicon (Si). A SiGe layer 2 having a greater lattice constant than Si is formed on the digital area of the Si substrate 1. A strained-Si layer 4 having substantially the same lattice constant as the lattice constant of the surface of the SiGe layer 2 is formed on the SiGe layer 2. The semiconductor device shown in FIG. 1 is thus formed.

Figure 2:
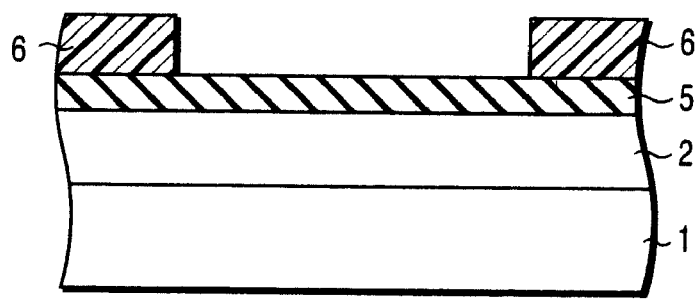
FIG. 2 is a cross-sectional view showing a method of manufacturing the semiconductor device shown in FIG. 1.

Next, a method of manufacturing the semiconductor device shown in FIG. 1 will be explained with reference to FIG. 1 to FIG. 6. In FIG. 2, the SiGe layer 2 is formed on the Si substrate 1 by, for example, epitaxial growth. The SiGe layer 2 has a thickness of, for example, 0.3 to 0.5 μm. Specifically, the thickness of the SiGe layer 2 is great enough to apply an adequate tensile strain to the strained-Si layer 4 and cause no defect in the SiGe layer 2.

A protection layer 5 is deposited on the SiGe layer 2. The protection layer 5 is formed of, for example, SiN. The protection layer 5 is used to prevent Si from being formed on the surface of the SiGe layer 2 when the Si layer is formed during the after-treatment. Next, a resist film 6 is applied to the surface of the protection layer 5, and is subjected to patterning by lithography so as to expose the protection layer 5 of the analog area.

Figure 3:
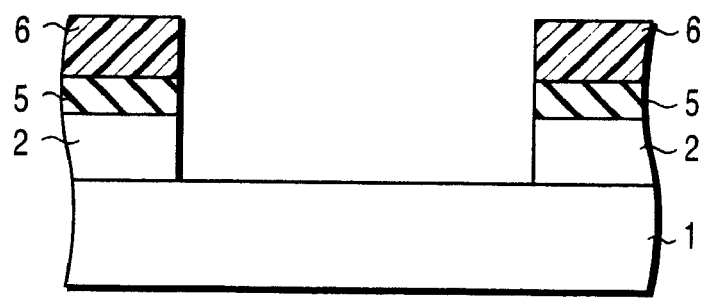
FIG. 3 is a cross-sectional view showing the manufacturing method subsequently to FIG. 2.
Figure 4:
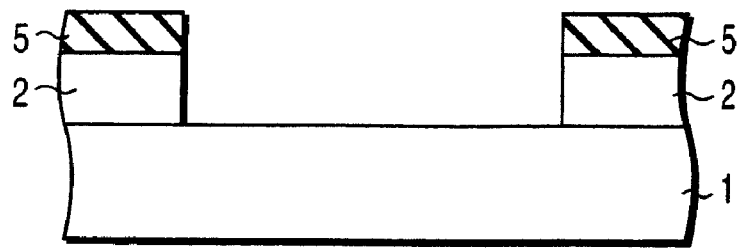
FIG. 4 is a cross-sectional view showing the manufacturing method subsequently to FIG. 3.

After that, the protection layer 5 is etched by wet etching using the resist film 6 as a mask, in FIG. 3. In addition, the SiGe layer 2 on the Si substrate 1 is entirely etched by using the resist film 6 as a mask. The SiGe layer 2 is thus formed on the digital area alone. Next, the resist film 6 is removed as shown in FIG. 4.

Figure 5:
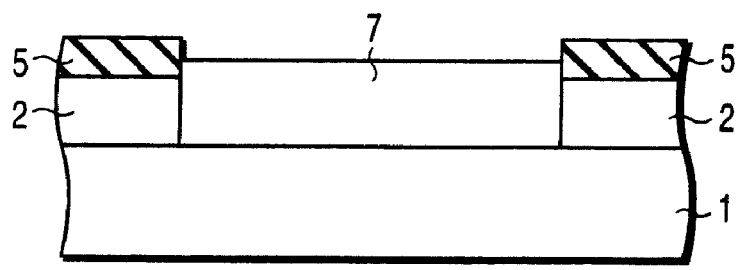
FIG. 5 is a cross-sectional view showing the manufacturing method subsequently to FIG. 4.
Figure 6:
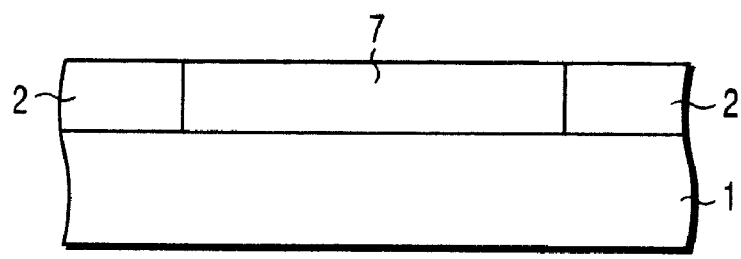
FIG. 6 is a cross-sectional view showing the manufacturing method subsequently to FIG. 5.

Next, a Si layer 7 having a greater thickness than the SiGe layer 2 is formed by epitaxial growth, on the Si substrate 1, as shown in FIG. 5. After that, the protection layer 5 is etched by wet etching as shown in FIG. 6. The surfaces of the SiGe layer 2 and the Si layer 7 are flattened by CMP (Chemical Mechanical Polishing) to become plane. The CMP step may be omitted.

Next, Si is subjected to epitaxial growth on the SiGe layer 2 and the Si layer 7 in FIG. 1. The strained-Si layer 4 is thereby formed on the SiGe layer 2. The Si layer 3 (including the Si layer 7) is formed on the Si layer 7. The semiconductor device shown in FIG. 1 is thus formed.

In the semiconductor device having this structure, the Si layer 3 and the strained-Si layer 4 having a greater lattice constant than the Si layer 3 can be formed on the same substrate. Thus, the leak current and noise can be reduced for the analog device and the like while the carrier mobility can be improved for the CMOS device, by forming the analog device and the like on the Si layer 3 and forming the CMOS device and the like on the strained-Si layer 4.

Figure 7:
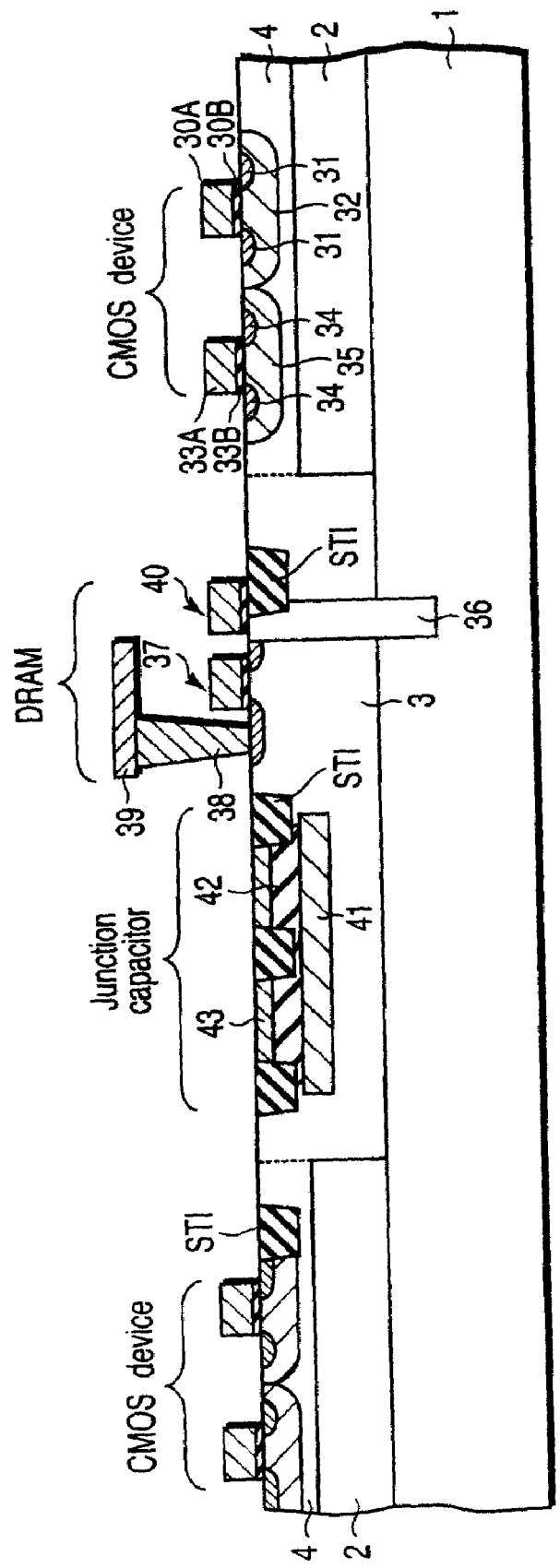
FIG. 7 is a cross-sectional view showing devices provided on the semiconductor device shown in FIG. 1.

FIG. 7 is a cross-sectional view showing an example of the semiconductor device comprising the devices. A device isolation area including an STI (Shallow Trench Isolation) is formed on the semiconductor device. The CMOS device is formed on the strained-Si layer 4 (i.e. the digital area).

The CMOS device includes a P-type MOSFET (Metal Oxide Semiconductor Field Effect Transistor) and an N-type MOSFET. An N-well 32 formed by diffusing a low-concentration N-type impurity is provided in the strained-Si layer 4. A gate electrode 30A is provided on the strained-Si layer 4 via a gate insulation film 30B. A source/drain area 31 formed by implanting a high-concentration P-type impurity is provided in the N-well 32 provided on each of both sides of the gate electrode 30A. The P-type MOSFET is thus formed.

In addition, a P-well 35 formed by diffusing a low-concentration P-type impurity is provided in the strained-Si layer 4. A gate electrode 33A is provided on the strained-Si layer 4 via a gate insulation film 33B. A source/drain area 34 formed by implanting a high-concentration N-type impurity is provided in the P-well 35 provided on each of both sides of the gate electrode 33A. The N-type MOSFET is thus formed.

The DRAM is formed on the Si layer 3 (i.e. the analog area). A trench capacitor 36 is provided on the Si layer 3. A MOSFET 37 is also provided on the Si layer 3. A source area of the MOSFET 37 is connected to the trench capacitor 36. A metal layer 39 (bit line) is provided over the Si layer 3. The metal layer 39 is connected to a drain area of the MOSFET 37 via a contact plug 38. A password line 40 is also provided on the Si layer 3 through an insulation film.

Furthermore, a junction capacitor is formed on the Si layer 3. A lower electrode 41 is provided in the Si layer 3. A capacitor dielectric film 42 is provided on the lower electrode 41. An upper electrode 43 is provided on the capacitor dielectric film 42 so as to be exposed from the surface of the Si layer 3.

As shown in FIG. 7, the CMOS device, the DRAM and the like can be formed on the same substrate, the leak current and noise can be reduced for the DRAM and the capacitor while the carrier mobility can be improved for the CMOS device.

Figure 8:
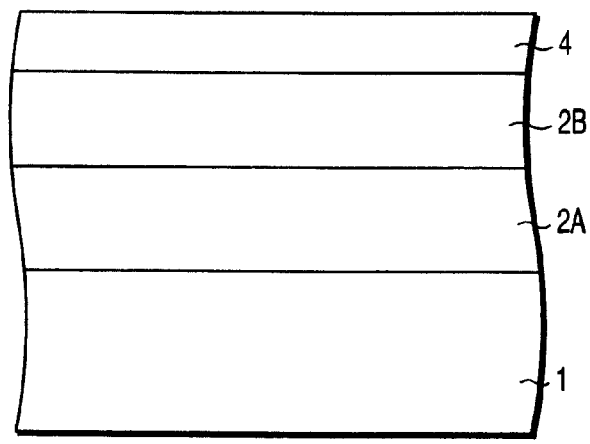
FIG. 8 is a cross-sectional view showing a structure of a SiGe layer 2 shown in FIG. 1.

Next, a structure of the SiGe layer 2 will be explained. FIG. 8 is a cross-sectional view showing the structure of the SiGe layer 2. The SiGe layer 2 of the present embodiment includes a buffer layer 2A and a lattice-relaxed layer 2B.

The buffer layer 2A is formed of silicon germanium $Si_{1-x}Ge_x$ in which the concentration of Ge is increased in the growth direction. In the buffer layer 2A, for example, the composition ratio is varied in a range of x=0 to 0.3 from the Si substrate 1 toward the top surface. The lattice-relaxed layer 2B is formed of silicon germanium $Si_{1-x}Ge_x$ including Ge at a constant concentration. The lattice-relaxed layer 2B has, for example, the composition ratio x=0.2 to 0.4. It is desirable that the lattice-relaxed layer 2B should have the composition ratio x=approximately 0.3.

The dislocation between the SiGe layer 2 and the Si substrate 1 surface can be reduced by forming the SiGe layer 2 in this manner. Similarly, the dislocation between the SiGe layer 2 and the strained-Si layer 4 can be reduced.

In a case where the dislocation hardly occurs between the Si substrate 1 and the lattice-relaxed layer 2B, the lattice-relaxed layer 2B may be formed on the Si substrate 1. In this case, the buffer layer 2A may not be required.

Figure 9:
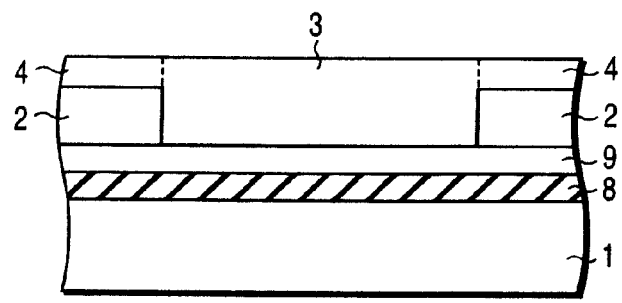
FIG. 9 is a cross-sectional view showing the semiconductor device of FIG. 1 having a SOI structure.

In the present embodiment, too, the substrate may have a SOI (Silicon On Insulator) structure. FIG. 9 is a cross-sectional view showing the semiconductor device having the SOI structure. An insulation layer 8 is provided on the Si substrate 1. The insulation layer 8 is formed of, for example, $SiO_2$.

A Si layer 9 is provided on the insulation layer 8. The structure of the Si layer 3, the SiGe layer 2 and the strained-Si layer 4 formed on the Si layer 9 is the same as that shown in FIG. 1. In addition, a method of forming the Si layer 3, the SiGe layer 2 and the strained-Si layer 4 are the same as the forming method explained with reference to FIG. 1.

As for an example of the method of manufacturing the SOI structure, the insulation layer 8 is first deposited on the Si substrate 1. Then the Si layer 9 is formed on the insulation layer 8. An existing SOI substrate may be prepared and used.

In the semiconductor device shown in FIG. 9, too, the leak current and noise can be reduced for the analog device and the like while the carrier mobility can be improved for the CMOS device, by forming the analog device and the like on the Si layer 3 and forming the CMOS device and the like on the strained-Si layer 4.

Furthermore, the parasitic capacitance of the substrate can be reduced by employing the SOI structure. The operation speed of the CMOS device can be thereby enhanced.

In the present embodiment, as described above in detail, the analog area where the analog device and the like are formed, and the digital area where the digital device is formed are separated on the same Si substrate 1. The Si layer 3 is formed in the analog area of the Si substrate 1 while the strained-Si layer 4 is formed in the digital area thereof.

According to the present embodiment, the analog device and the like, and the digital device can be therefore formed on the same substrate. If the analog device and the like, and the digital device are formed on the same substrate, the leak current and noise can be reduced for the analog device and the like while the carrier mobility can be improved for the CMOS device.

The SiGe layer 2 includes the buffer layer 2A and the lattice-relaxed layer 2B. The dislocation between the SiGe layer 2 and the layers which are in contact therewith can be therefore reduced.

If the Si substrate 1 has the SOI structure, the operation speed of the CMOS device can be further enhanced by reducing the parasitic capacitance.

Second Embodiment

Figure 10:
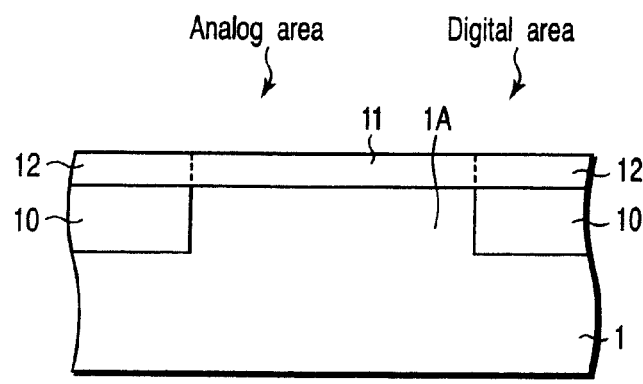
FIG. 10 is a cross-sectional view showing main portions of a semiconductor device according to a second embodiment of the present invention.

FIG. 10 is a cross-sectional view showing main portions of a semiconductor device according to a second embodiment of the present invention. The Si substrate 1 has a protrusion 1A. The protrusion 1A is formed in the analog area of the Si substrate 1. The protrusion 1A is also formed of the same material as the Si substrate 1.

There is a digital area on each of both sides of the protrusion 1A. A SiGe layer 10 is formed in the digital area of the Si substrate 1. In other words, the SiGe layer 10 has a top surface exposed, and is embedded in the Si substrate 1. The structure of the SiGe layer 10 is the same as that of the SiGe layer 2 of the first embodiment.

A Si layer 11 is formed on the protrusion 1A. A strained-Si layer 12 having substantially the same lattice constant as the lattice constant of the surface of the SiGe layer 10 is formed on the SiGe layer 10. The semiconductor device shown in FIG. 10 is thus formed.

Figure 11:
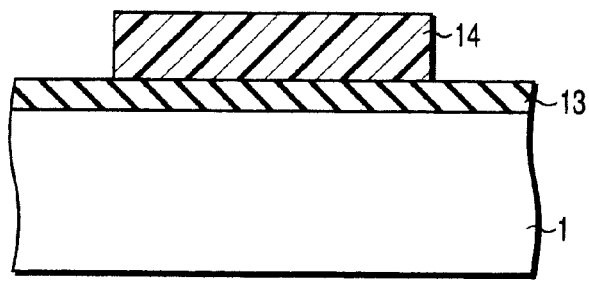
FIG. 11 is a cross-sectional view showing a method of manufacturing the semiconductor device shown in FIG. 10.

Next, a method of manufacturing the semiconductor device shown in FIG. 10 will be explained with reference to FIG. 10 to FIG. 14. In FIG. 11, a protection layer 13 is deposited on the Si substrate 1. The protection layer 13 is formed of, for example, SiN. The protection layer 13 is used to prevent SiGe from being formed on the surface of the Si substrate 1 when the SiGe layer is formed during the after-treatment.

Next, a resist film 14 is applied to the surface of the protection layer 13, and is subjected to patterning by lithography so as to expose the protection layer 13 of the digital area.

After that, the protection layer 13 is etched by using the resist film 14 as a mask, in FIG. 12. In addition, the Si substrate 1 is etched to a predetermined depth by using the resist film 14 as a mask. The predetermined depth corresponds to the thickness of the SiGe layer 10. The thickness of the SiGe layer 10 is great enough to apply an adequate tensile strain to the strained-Si layer 12 and cause no defect in the SiGe layer 10. The protrusion 1A is thus formed. After that, the resist film 14 is removed.

Next, the SiGe layer 10 is formed on the Si substrate 1 of the digital area by epitaxial growth such that the top surface of the SiGe layer 10 is higher than the top surface of the protrusion 1A as shown in FIG. 13. The protection layer 13 is etched by wet etching as shown in FIG. 14. The surfaces of the SiGe layer 10 and the protrusion 1A are flattened by CMP (Chemical Mechanical Polishing) to become plane. The CMP step may be omitted.

Next, Si is subjected to epitaxial growth on the SiGe layer 10 and the protrusion 1A in FIG. 10. The strained-Si layer 12 is thereby formed on the SiGe layer 10. The Si layer 11 is formed on the protrusion 1A. The semiconductor device shown in FIG. 10 is thus formed.

In the semiconductor device having this structure, the Si layer 11 and the strained-Si layer 12 having a greater lattice constant than the Si layer 11 can be formed on the same substrate. Thus, the leak current and noise can be reduced for the analog device and the like while the carrier mobility can be improved for the CMOS device, by forming the analog device and the like on the Si layer 11 and forming the CMOS device and the like on the strained-Si layer 12.

In addition, if the devices shown in FIG. 7 are formed on the semiconductor device shown in FIG. 10, the characteristics of the devices can be improved. The other advantage is also the same as that of the first embodiment.

The structure of the semiconductor device according to the present embodiment is substantially the same as that of the semiconductor device according to the first embodiment. However, the semiconductor device can be effectively manufactured by selecting the manufacturing method of the first embodiment or that of the second embodiment in accordance with the extent of the analog area and the digital area.

In the present embodiment, the Si substrate 1 may have the SOI (Silicon On Insulator) structure. FIG. 15 is a cross-sectional view showing the semiconductor device having the SOI structure. The insulation layer 8 is provided on the Si substrate 1. The insulation layer 8 is formed of, for example, SiO$_2$. The Si layer 9 is provided on the insulation layer 8. The other constituent elements are the same as those of FIG. 10.

In the semiconductor device shown in FIG. 15, the SiGe layer 10 may reach the Si substrate 1. FIG. 16 is a cross-sectional view showing the semiconductor device of FIG. 15 in which the SiGe layer 10 reaches the Si substrate 1. An example of a method of manufacturing the semiconductor device shown in FIG. 16 is explained below.

For example, the Si layer 9 of the digital area is etched by using the resist film 14 shown in FIG. 11 as a mask, on a SOI substrate (not shown), and the insulation layer 8 is etched to expose the Si substrate 1. Then the resist film 14 is removed.

Next, the SiGe layer 10 having a higher top surface than the top surface of the Si layer 9 of the analog area is formed on the Si substrate 1 of the digital area by epitaxial growth. The following steps of the manufacturing method are the same as those of the manufacturing method shown in FIG. 10.

In the semiconductor devices shown in FIG. 15 and FIG. 16, too, the Si layer 11 and the strained-Si layers 12 having a greater lattice constant than the Si layer 11 can be formed on the same substrate. In addition, the parasitic capacitance can be reduced by employing the SOI structure and the operation speed of the devices formed on the Si layer 11 and the Si layer 9 can be thereby enhanced.

Third Embodiment

Figure 17:
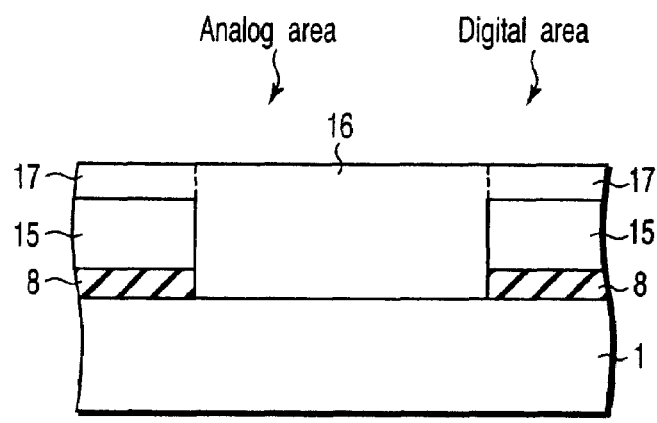
FIG. 17 is a cross-sectional view showing main portions of a semiconductor device according to a third embodiment of the present invention.

FIG. 17 is a cross-sectional view showing main portions of a semiconductor device according to a third embodiment of the present invention. A Si layer 16 is provided in the analog area of the Si substrate 1. The insulation layer 8 formed of, for example, SiO$_2$ is provided in the digital area of the Si substrate 1.

A SiGe layer 15 is provided on the insulation layer 8. The structure of the SiGe layer 15 is the same as that of the SiGe layer 2 of the first embodiment. A Si layer 17 having substantially the same lattice constant as that of the top surface of the SiGe layer 15 is provided on the SiGe layer 15. The semiconductor device shown in FIG. 17 is thus formed.

Figure 18:
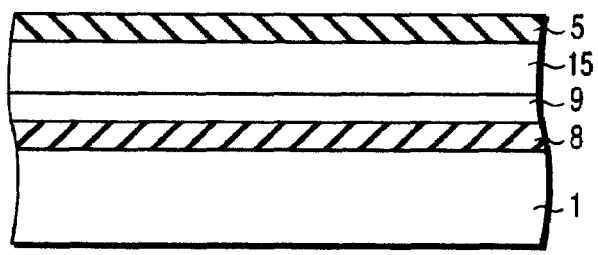
FIG. 18 is a cross-sectional view showing a method of manufacturing the semiconductor device shown in FIG. 17.

Next, a method of manufacturing the semiconductor device shown in FIG. 17 will be explained with reference to FIG. 17 to FIG. 22. In FIG. 18, the insulation layer 8 is formed on the Si substrate 1. The Si layer 9 is formed on the insulation layer 8. An existing SOI substrate may be prepared and used.

Next, the SiGe layer 15 is formed on the Si layer 9 by epitaxial growth. The protection layer 5 formed of SiN is deposited on the SiGe layer 15.

Figure 19:
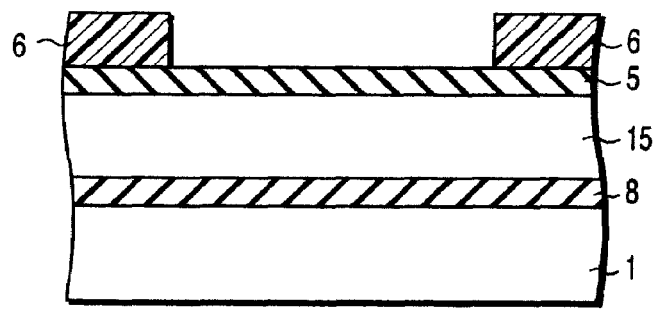
FIG. 19 is a cross-sectional view showing the manufacturing method subsequently to FIG. 18.

The semiconductor device is annealed in FIG. 19. Ge in the SiGe layer 15 is thermally diffused to the Si layer 9 and the Si layer 9 becomes the SiGe layer 15, by the annealing. The resist film 6 is applied to the surface of the protection layer 5, and is subjected to patterning by lithography so as to expose the protection layer 5 of the analog area.

Figure 20:
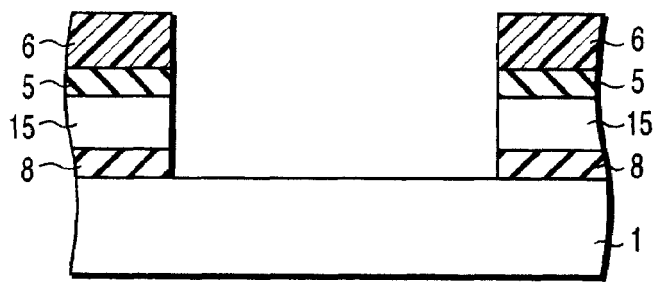
FIG. 20 is a cross-sectional view showing the manufacturing method subsequently to FIG. 19.

After that, the protection layer 5 is etched by using the resist film 6 as a mask, in FIG. 20. The SiGe layer 15 is also etched by using the resist film 6 as a mask. Furthermore, the insulation layer 8 is also etched by using the resist film 6 as a mask. The surface of the Si substrate 1 in the analog area is thus exposed.

Figure 21:
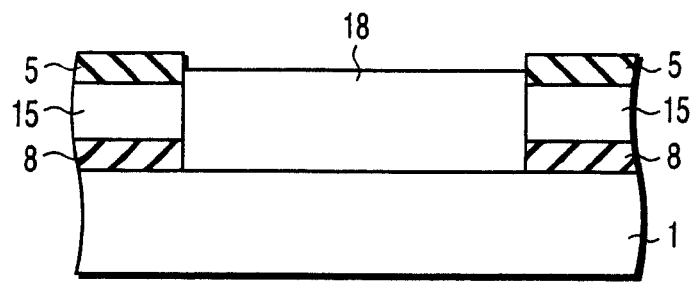
FIG. 21 is a cross-sectional view showing the manufacturing method subsequently to FIG. 20.
Figure 22:
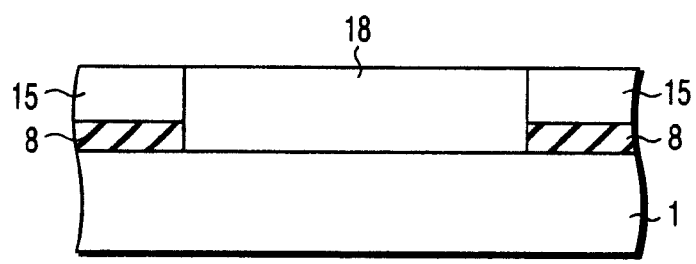
FIG. 22 is a cross-sectional view showing the manufacturing method subsequently to FIG. 21.

The resist film 6 is removed as shown in FIG. 21. A Si layer 18 is formed on the Si substrate 1 by epitaxial growth such that the top surface of the Si layer 18 is higher than the top surface of the SiGe layer 15. In FIG. 22, the protection layer 5 is etched by wet etching. The surfaces of the SiGe layer 15 and the Si layer 18 are flattened by the CMP to become plane.

Si is subjected to epitaxial growth on the SiGe layer 15 and the Si layer 18 as shown in FIG. 17. The Si layer 17 is thereby formed on the SiGe layer 15.

The Si layer 16 (including the Si layer 18) is formed on the Si substrate 1 of the analog area. The semiconductor device of FIG. 17 is thus formed.

In the semiconductor device having this structure, the insulation layer 8 can be formed below the Si layer 17 of the digital area alone. Therefore, since the parasitic capacitance can be reduced, the operation speed of the CMOS device can be enhanced.

Figure 23:
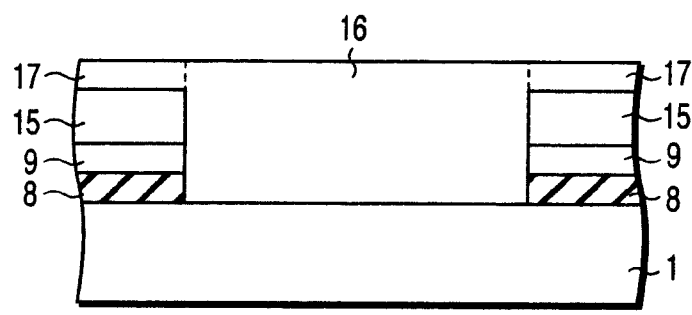
FIG. 23 is a cross-sectional view showing the semiconductor device of FIG. 17 further having a Si layer 9 on an insulation layer 8.

If the concentration of Ge in the SiGe layer 15 is low or thermal diffusion of Ge does not largely occur, the Si layer 9 does not entirely become the SiGe layer 15, but remains as it is. FIG. 23 is a cross-sectional view showing the semiconductor device having the Si layer 9 on the insulation layer 8.

In the semiconductor device having this structure, too, the same advantage as that of the present embodiment can be obtained. Moreover, it is possible to prevent a defect from being caused in an interface between the Si layer 9 and the SiGe layer 15 as compared with a case where the SiGe layer 15 is stacked on the Si layer 9.

Fourth Embodiment

Figure 24:
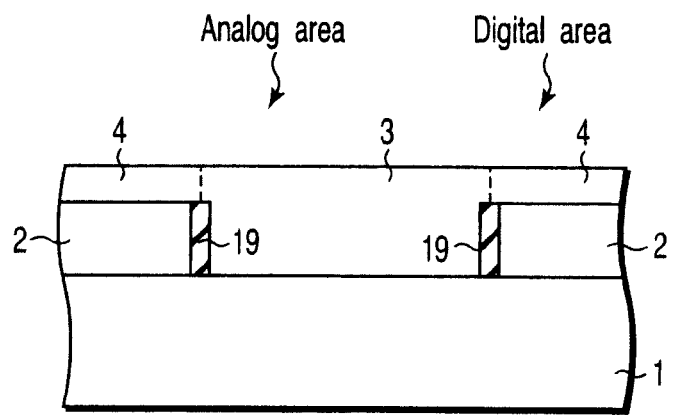
FIG. 24 is a cross-sectional view showing main portions of a semiconductor device according to a fourth embodiment of the present invention.

FIG. 24 is a cross-sectional view showing main portions of a semiconductor device according to a fourth embodiment of the present invention. The Si layer 3 is provided in the analog area of the Si substrate 1. The SiGe layer 2 is provided in the digital area of the Si substrate 1.

A buffer film 19 is provided between the Si layer 3 and the SiGe layer 2 to prevent a fault from being caused at a bonding portion between the Si layer 3 and the SiGe layer 2. In other words, the buffer film 19 is formed of a material such as SiN, which can absorb the stress caused by the SiGe layer 2 or the fault resulting from the SiGe layer 2.

The strained-Si layer 4 is provided on the SiGe layer 2. The semiconductor device of FIG. 24 is thus formed.

Figure 25:
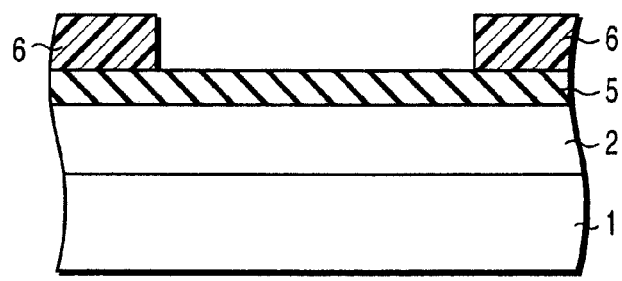
FIG. 25 is a cross-sectional view showing a method of manufacturing the semiconductor device shown in FIG. 24.

Next, a method of manufacturing the semiconductor device shown in FIG. 24 will be explained with reference to FIG. 24 to FIG. 29. In FIG. 25, fort example, the SiGe layer 2 is formed on the Si substrate 1 by epitaxial growth.

The protection layer 5 is deposited on the SiGe layer 2. The resist film 6 is applied to the surface of the protection layer 5, and is subjected to patterning by lithography so as to expose the protection layer 5 of the analog area.

Figure 26:
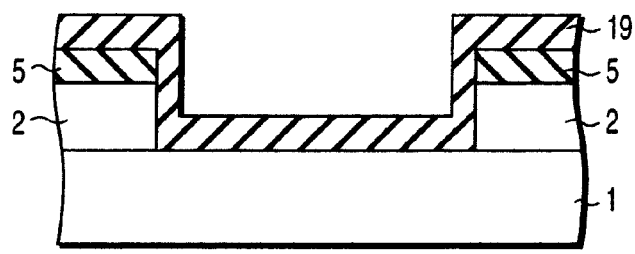
FIG. 26 is a cross-sectional view showing the manufacturing method subsequently to FIG. 25.

After that, the protection layer 5 is etched by using the resist film 6 as a mask, in FIG. 26. The SiGe layer 2 is also etched by using the resist film 6 as a mask. Then, the resist film 6 is removed. The buffer film 19 formed of, for example, SiN is deposited on the entire surface of the semiconductor device.

Figure 27:
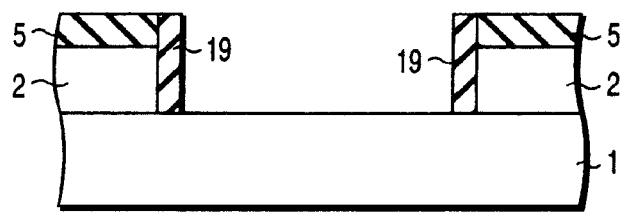
FIG. 27 is a cross-sectional view showing the manufacturing method subsequently to FIG. 26.

The buffer film 19 on the Si substrate 1 and the protection layer 5 is etched by anisotropic etching in FIG. 27. The buffer film 19 is thereby formed on side surfaces of the SiGe layer 2 alone.

Figure 28:
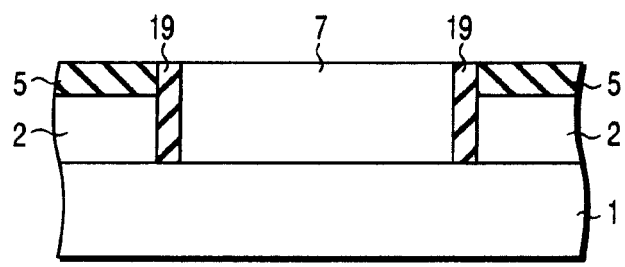
FIG. 28 is a cross-sectional view showing the manufacturing method subsequently to FIG. 27.
Figure 29:
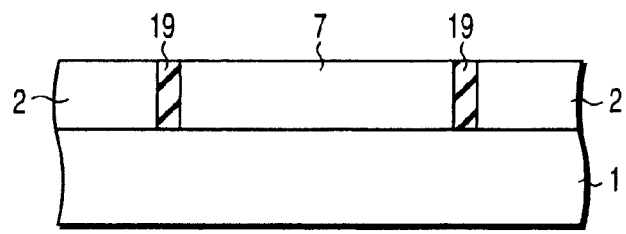
FIG. 29 is a cross-sectional view showing the manufacturing method subsequently to FIG. 28.

The Si layer 7 having a greater thickness than the SiGe layer 2 is formed on the Si substrate 1 by epitaxial growth, as shown in FIG. 28. In FIG. 29, the protection layer 5 is etched by the wet etching. The surfaces of the SiGe layer 2 and the Si layer 7 are flattened by the CMP to become plane.

Next, Si is subjected to epitaxial growth on the SiGe layer 2 and the Si layer 7 as shown in FIG. 24. The strained-Si layer 4 is thereby formed on the SiGe layer 2. The Si layer 3 (including the Si layer 7) is formed on the Si layer 7.

Si is not subjected to epitaxial growth on the buffer film 19. By thinning the buffer film 19, however, cavities are not generated between the Si layer 3 and the strained-Si layer 4, due to extension of Si from the SiGe layer 2 and the Si layer 7. The semiconductor device shown in FIG. 24 is thus formed.

The composition ratio of Ge in the SiGe layer 2 becomes larger toward the top surface of the layer. In other words, the lattice constant of the SiGe layer 2 becomes larger toward the top surface. Thus, if the composition ratio of Ge is made larger, a fault may occur at the bonding portion between the SiGe layer 2 and the Si layer 3.

In the present embodiment, however, the buffer film 19 is provided between the SiGe layer 2 and the Si layer 3. The buffer film 19 absorbs the stress caused by the SiGe layer 2 or the fault resulting from the SiGe layer 2. The buffer film 19 also prevents the stress caused by the SiGe layer 2 or the like from being applied to the bonding portion between the SiGe layer 2 and the Si layer 3. The fault between the SiGe layer 2 and the Si layer 3 can be thereby reduced. The other advantages are the same as those of the first embodiment.

In the present embodiment, too, the Si substrate 1 may have the SOI structure. FIG. 30 is a cross-sectional view showing the semiconductor device having the SOI structure. With this structure, the same advantages as those of the semiconductor device described with reference to FIG. 9 can be obtained.

Fifth Embodiment

FIG. 31 is a cross-sectional view showing main portions of a semiconductor device according to a fifth embodiment of the present invention. The Si substrate 1 has the protrusion 1A. The protrusion 1A is formed in the analog area of the Si substrate 1.

There is the digital area on each of both sides of the protrusion 1A. The SiGe layer 10 is formed in the digital area of the Si substrate 1. In other words, the SiGe layer 10 has a top surface exposed, and is embedded in the Si substrate 1. In addition, a buffer film 20 is provided between the protrusion 1A and the SiGe layer 10. The buffer film 20 is formed of, for example, SiN.

The Si layer 11 is formed on the protrusion 1A. The strained-Si layer 12 is formed on the SiGe layer 10. The semiconductor device shown in FIG. 31 is thus formed.

Next, a method of manufacturing the semiconductor device shown in FIG. 31 will be explained with reference to FIG. 31 to FIG. 35. In FIG. 32, the protection layer 13 is deposited on the Si substrate 1. The resist film 14 is applied to the surface of the protection layer 13, and is subjected to patterning by lithography so as to expose the protection layer 13 of the digital area.

Next, the protection layer 13 is etched by using the resist film 14 as a mask, in FIG. 33. In addition, the Si substrate 1 is etched to a predetermined depth by using the resist film 14 as a mask. The protrusion 1A is thus formed.

After that, the resist film 14 is removed. The buffer film 20 formed of, for example, SiN is deposited on the entire surface of the semiconductor device.

Figure 34:
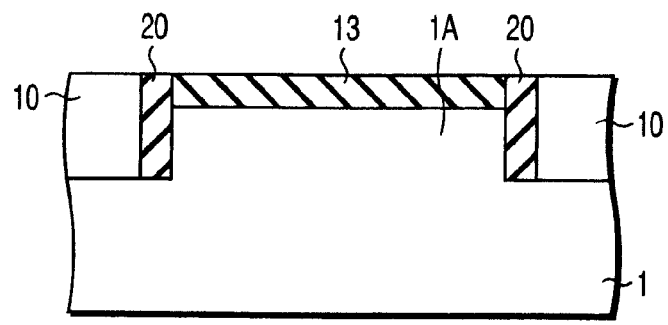
FIG. 34 is a cross-sectional view showing the manufacturing method subsequently to FIG. 33.

In FIG. 34, the buffer film 20 on the Si substrate 1 and the protection layer 13 is etched by anisotropic etching. The buffer film 20 is thus formed on both sides of the protrusion 1A. Furthermore, the SiGe layer 10 is formed on the Si substrate 1 of the digital area by epitaxial growth such that the top surface of the SiGe layer 10 is higher than the top surface of the protrusion 1A.

Figure 35:
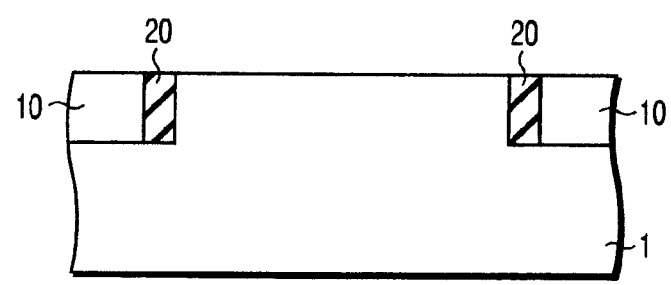
FIG. 35 is a cross-sectional view showing the manufacturing method subsequently to FIG. 34.

In FIG. 35, the protection layer 13 is etched by wet etching. The surfaces of the SiGe layer 10 and the protrusion 1A are flattened by the CMP to become plane.

Next, Si is subjected to epitaxial growth on the SiGe layer 10 and the protrusion 1A in FIG. 31. The strained-Si layer 12 is thereby formed on the SiGe layer 10. The Si layer 11 is formed on the protrusion 1A.

Si is not subjected to epitaxial growth on the buffer film 20. By thinning the buffer film 19, however, cavities are not generated between the Si layer 11 and the strained-Si layer 12, due to extension of Si from the SiGe layer 10 and the protrusion 1A, The semiconductor device shown in FIG. 31 is thus formed.

In the present embodiment, as described above, the buffer film 20 is provided between the SiGe layer 10 and the protrusion 1A. Therefore, the fault generated at the bonding portion between the SiGe layer 10 and the protrusion 1A can be reduced.

Figure 36:
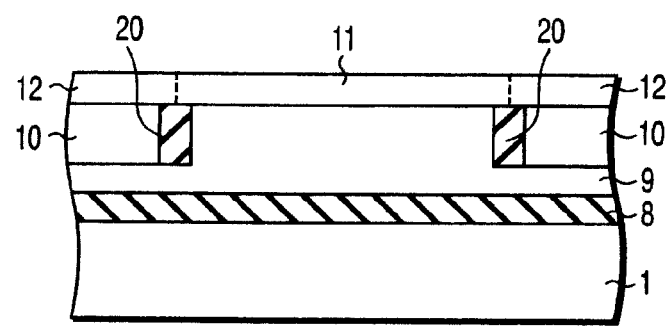
FIG. 36 is a cross-sectional view showing the semiconductor device of FIG. 31 having a SOI structure.

In the present embodiment, too, the Si substrate 1 may have the SOI structure. FIG. 36 is a cross-sectional view showing the semiconductor device having the SOI structure. With this structure, the same advantages as those of the semiconductor device described with reference to FIG. 15 can be obtained.

Figure 37:
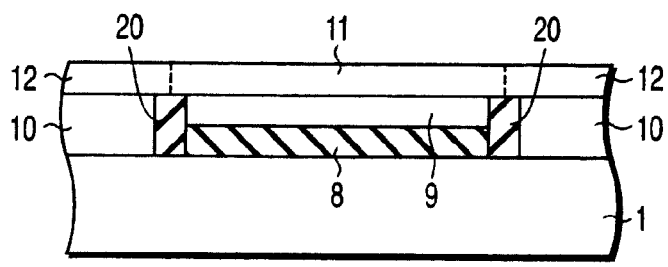
FIG. 37 is a cross-sectional view showing the semiconductor device of FIG. 36 in which the SiGe layer 10 reaches the Si substrate 1.

In the semiconductor device shown in FIG. 36, the SiGe layer 10 may reach the insulation layer 8. FIG. 37 is a cross-sectional view showing the semiconductor device of FIG. 36 in which the SiGe layer 10 reaches the insulation layer 8. With this structure, the same advantages as those of the semiconductor device described with reference to FIG. 16 can be obtained.

Figure 38:
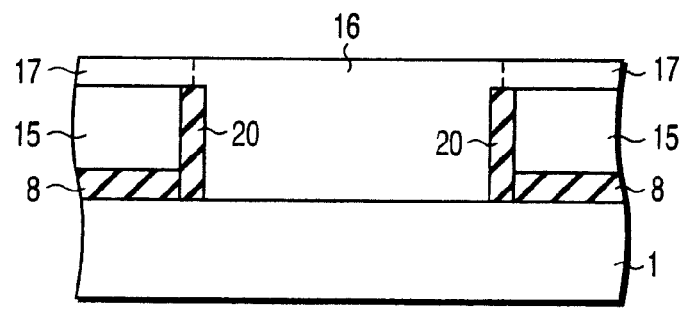
FIG. 38 is a cross-sectional view showing the semiconductor device of FIG. 17 further having a buffer film 20.

Moreover, the semiconductor device of the third embodiment shown in FIG. 17 may have the buffer film 20. FIG. 38 is a cross-sectional view showing the semiconductor device of FIG. 17 further having the buffer film 20. With this structure, the fault generated at the bonding portion between the Si layer 16 and the SiGe layer 15 can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon substrate having a first area, a second area adjacent to the first area, and a protrusion arranged in the first area;
   a first silicon layer which is provided on the protrusion;
   a relaxed layer which is provided on the silicon substrate in the second area and which has a lattice constant greater than a lattice constant of the silicon substrate; and
   a strained-Si layer which is provided on the relaxed layer and which has a lattice constant substantially equivalent to the lattice constant of the relaxed layer,
   wherein the first silicon layer and the strained-Si layer comprise a same layer.

2. The semiconductor device according to claim 1, further comprising a buffer film provided between the protrusion and the relaxed layer.

3. The semiconductor device according to claim 2, wherein the buffer film is formed of silicon nitride.

4. The semiconductor device according to claim 2, wherein
   the first area is an area in which a memory device and/or an analog device is formed, and
   the second area is an area in which a digital device is formed.

5. The semiconductor device according to claim 1, further comprising a buffer layer provided between the relaxed layer and the silicon substrate, a lattice constant of the buffer layer becoming greater than a lattice constant of silicon toward a top surface of the buffer layer.

6. The semiconductor device according to claim 1, wherein the silicon substrate is a Silicon on Insulator (SOI) substrate, and
   the silicon substrate includes an insulation layer and a second silicon layer provided on the insulation layer.

7. The semiconductor device according to claim 1, further comprising an insulation layer provided in the silicon substrate and below the protrusion.

8. The semiconductor device according to claim 1, wherein a side surface of the first silicon layer is in contact with the strained-Si layer.

9. The semiconductor device according to claim 1, further comprising an insulation layer provided between the silicon substrate and the protrusion.

10. The semiconductor device according to claim 1, wherein the first silicon layer provided on the protrusion is substantially not strained.

11. The semiconductor device according to claim 10, wherein the protrusion does not include a relaxed layer or a SiGe layer.

12. The semiconductor device according to claim 11, further comprising a buffer film disposed only on a side surface of the protrusion.

13. The semiconductor device according to claim 12, wherein the buffer film comprises silicon nitride.

14. A semiconductor device, comprising:
   a silicon substrate having a first area, a second area adjacent to the first area, and a protrusion arranged in the first area;
   a substantially unstrained silicon layer disposed over the protrusion in the first area;
   a relaxed layer disposed over the silicon substrate in the second area, wherein the relaxed layer has a lattice constant greater than a lattice constant of the silicon substrate; and
   a strained-Si layer disposed over the relaxed layer, wherein the strained-Si layer has a lattice constant substantially equivalent to the lattice constant of the relaxed layer;
   wherein the substantially unstrained silicon layer and the strained-Si layer form a single layer.

15. The semiconductor device of claim 14, wherein the protrusion does not include a relaxed layer or a SiGe layer.

16. The semiconductor device of claim 14, wherein a side surface of the substantially unstrained silicon layer and a side surface of the strained-Si layer are in contact.

17. The semiconductor device of claim 14, further comprising one of an analog device or a memory device disposed over the substantially unstrained silicon layer, and a digital device disposed over the strained-Si layer.

18. The semiconductor device of claim 14, further comprising one of a DRAM (Dynamic Random Access Memory), an SRAM (Static Random Access Memory), a flash memory, a capacitor, or an amplifying element configured to process a high-frequency signal disposed over the substantially unstrained silicon layer, and a CMOS (Complementary Metal Oxide Semiconductor) device disposed over the strained-Si layer.

19. The semiconductor device of claim 14, further comprising a buffer film disposed only on a side surface of the protrusion.

20. The semiconductor device of claim 19, wherein the buffer film comprises silicon nitride.

* * * * *

US007737466C1

(12) EX PARTE REEXAMINATION CERTIFICATE (10400th)
United States Patent
Hiyama et al.

(10) Number: US 7,737,466 C1
(45) Certificate Issued: Nov. 12, 2014

(54) SEMICONDUCTOR DEVICE AND MANUFACTURING METHOD THEREOF

(75) Inventors: Kaoru Hiyama, Yokohama (JP); Tomoya Sanuki, Yokohama (JP); Osamu Fujii, Yokohama (JP)

(73) Assignee: Kabushiki Kaisha Toshiba, Minato-ku, Tokyo (JP)

Reexamination Request:
No. 90/020,043, Nov. 19, 2013

Reexamination Certificate for:
Patent No.: 7,737,466
Issued: Jun. 15, 2010
Appl. No.: 11/889,420
Filed: Aug. 13, 2007

Related U.S. Application Data

(62) Division of application No. 11/026,542, filed on Jan. 3, 2005, now abandoned.

(30) Foreign Application Priority Data

Jan. 6, 2004 (JP) ................................. 2004-001075

(51) Int. Cl.
*H01L 29/06* (2006.01)
*H01L 35/26* (2006.01)

(52) U.S. Cl.
USPC ............. 257/190; 257/194; 257/616; 257/18; 257/19

(58) Field of Classification Search
None
See application file for complete search history.

(56) References Cited

To view the complete listing of prior art documents cited during the proceeding for Reexamination Control Number 90/020,043, please refer to the USPTO's public Patent Application Information Retrieval (PAIR) system under the Display References tab.

*Primary Examiner* — Leonardo Andujar

(57) ABSTRACT

A semiconductor device includes a substrate having a first area and a second area adjacent to the first area, a first silicon layer provided on the substrate in the first area, a relaxed layer which is provided on the substrate in the second area and which has a lattice constant greater than a lattice constant of the first silicon layer, and a strained-Si layer which is provided on the relaxed layer and which has a lattice constant substantially equivalent to the lattice constant of the relaxed layer.

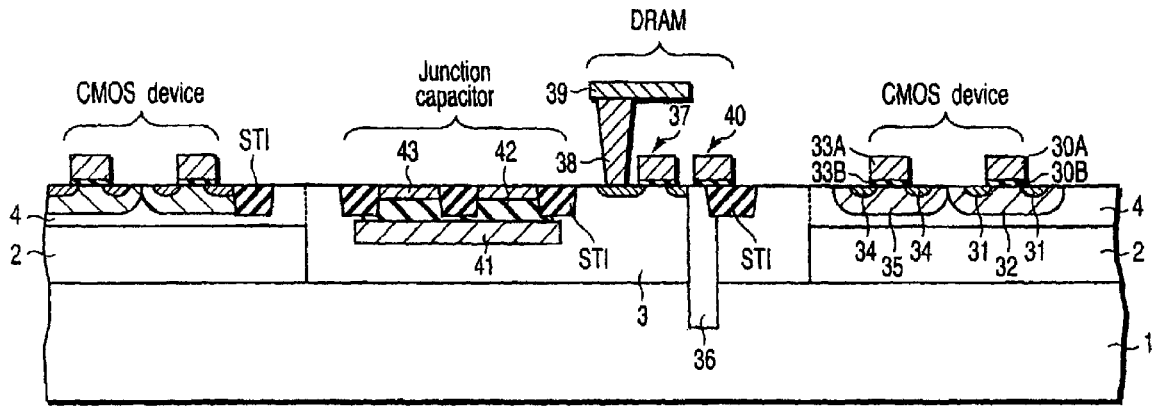

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-20 are cancelled.

\* \* \* \* \*